(12) United States Patent
Aktas et al.

(10) Patent No.: US 9,123,799 B2
(45) Date of Patent: Sep. 1, 2015

(54) GALLIUM NITRIDE FIELD EFFECT TRANSISTOR WITH BURIED FIELD PLATE PROTECTED LATERAL CHANNEL

(71) Applicant: AVOGY, INC., San Jose, CA (US)

(72) Inventors: Ozgur Aktas, Pleasanton, CA (US); Isik C. Kizilyalli, San Francisco, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/077,039

(22) Filed: Nov. 11, 2013

(65) Prior Publication Data

US 2015/0129886 A1 May 14, 2015

(51) Int. Cl.
*H01L 29/735* (2006.01)
*H01L 29/78* (2006.01)
*H01L 29/20* (2006.01)
*H01L 29/66* (2006.01)
*H01L 29/40* (2006.01)

(52) U.S. Cl.
CPC ........ *H01L 29/7802* (2013.01); *H01L 29/2003* (2013.01); *H01L 29/407* (2013.01); *H01L 29/66681* (2013.01); *H01L 29/66712* (2013.01); *H01L 29/7816* (2013.01)

(58) Field of Classification Search
CPC ............ H01L 27/1122; H01L 29/6625; H01L 29/735; H01L 31/03044; H01L 31/1856; H01L 29/66431; H01L 29/66462; H01L 29/778; H01L 29/7781; H01L 29/7782; H01L 29/7786; H01L 2924/13064
See application file for complete search history.

(56) References Cited

U.S. PATENT DOCUMENTS

| | | | |
|---|---|---|---|
| 6,643,134 B2 | 11/2003 | Ashiya et al. | |
| 2009/0146182 A1* | 6/2009 | Hikita et al. | 257/190 |
| 2010/0117094 A1* | 5/2010 | Nishikawa et al. | 257/76 |
| 2011/0227093 A1* | 9/2011 | Hikita et al. | 257/76 |
| 2013/0032814 A1 | 2/2013 | Bour et al. | |

* cited by examiner

*Primary Examiner* — Kyoung Lee
*Assistant Examiner* — Mikka Liu
(74) *Attorney, Agent, or Firm* — Kilpatrick Townsend & Stockton LLP

(57) ABSTRACT

A method for fabricating a lateral gallium nitride (GaN) field-effect transistor includes forming a first and second GaN layer coupled to a substrate, removing a first portion of the second GaN layer to expose a portion of the first GaN layer, and forming a third GaN layer coupled to the second GaN layer and the exposed portion of the first GaN layer. The method also includes removing a portion of the third GaN layer to expose a portion of the second GaN layer, forming a source structure coupled to the third GaN layer. A first portion of the second GaN layer is disposed between the source structure and the second GaN layer. A drain structure is formed that is coupled to the third GaN layer or alternatively to the substrate. The method also includes forming a gate structure coupled to the third GaN layer such that a second portion of the third GaN layer is disposed between the gate structure and the second GaN layer.

13 Claims, 13 Drawing Sheets

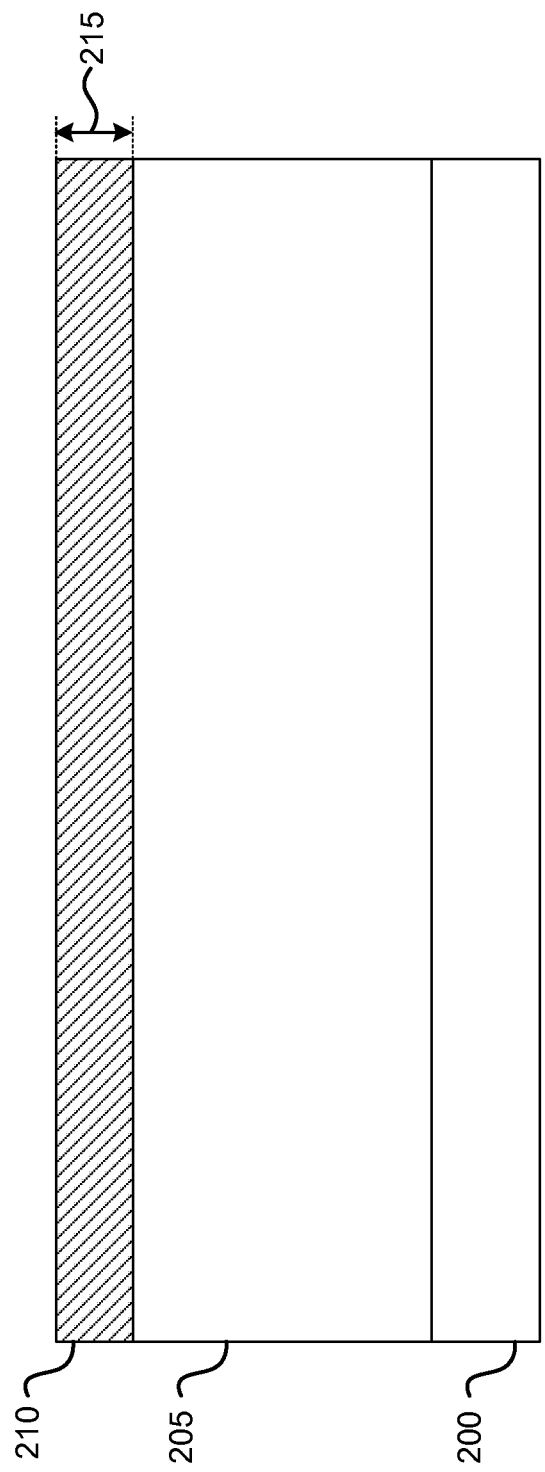

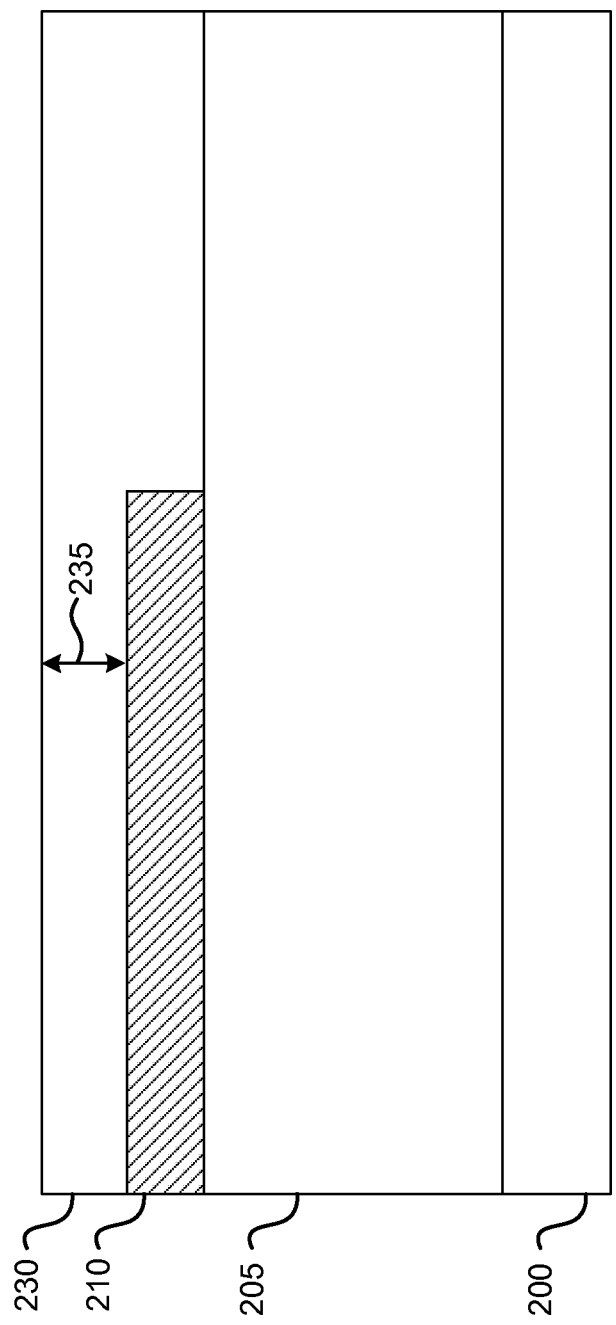

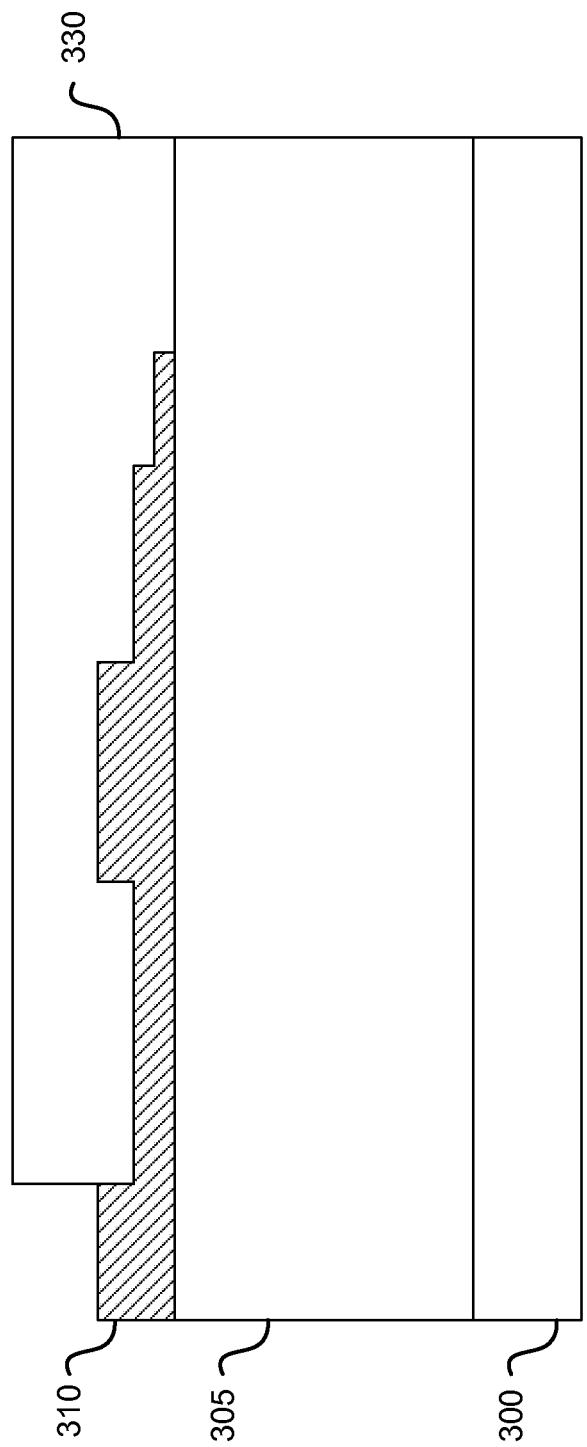

GALLIUM NITRIDE FIELD EFFECT TRANSISTOR WITH BURIED FIELD PLATE PROTECTED LATERAL CHANNEL

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to providing a buried field plate in a lateral channel high voltage device made with high band gap materials. Merely by way of example, the invention has been applied to methods and systems for manufacturing field-effect transistors (FETs) using gallium nitride (GaN) (and/or other III-V materials), as well as silicon carbide (SiC). In fact, the methods and techniques provided herein can be applied to a variety of FET devices such as the junction field effect transistor (JFET), metal-semiconductor field effect transistor (MESFET), high-electron-mobility transistor (HEMT), and/or other such structures. Within this disclosure we recognize that all FET devices have a common structure with common function blocks that stems from the principle of field-effect control of the current flow.

Without limiting embodiments of the present invention, without an attempt to provide a complete specification of the field-effect transistor, and considering only an idealized device structure without various secondary mechanisms and events, the major components of a field effect transistor: source, drain, gate, substrate, channel and drift-region. The charge carriers forming the device current, which is controlled by the FET, enters the FET from the source and leaves from the drain. The device current is controlled by the gate, which depending on the potential applied the gate, creates a field profile that affects the desired outcome of controlling the current to a desired level. The gate lies in close physical proximity to the channel. The channel is the region of the device where the majority of the field effect control of the device current is achieved. The drift-region is the region of the device that carries the device current from the channel region to the drain. The drift region sustains the majority of the potential drop across the device when the device is in non-conducting mode under high drain bias. The substrate is the physical structure on which the other components are located. The methods and techniques provided herein can be applied to a variety of devices deriving functionality from a subset of the components of a FET device. For example, for an insulated gate FET (IGFET), the gate can be used as a one of the plates of high voltage capacitor. For a MESFET, the gate, channel, drift region and drain can be used to form a high voltage rectifier.

Within the description of the present process flows, it should be appreciated that the channel and the drift-region can be manufactured to lie along and conduct current along either the lateral or vertical direction. In this context, the lateral direction is understood to be the direction parallel to the planar surface of the substrate and the vertical direction is understood to be the direction perpendicular/normal to the planar surface of the substrate. Embodiments of the present invention provide a buried field plate for lateral channel FET devices that can incorporate either a lateral or vertical drift region.

According to an embodiment of the present invention, a method for fabricating a lateral channel GaN field-effect transistor (FET) protected by a buried field plate is provided. The method includes providing a substrate and forming a first GaN layer coupled to the substrate. The first GaN layer has a first conductivity type. The method further includes forming a second GaN layer coupled to the first layer. The second layer has a second conductivity type. The method further includes removing a first portion of the second GaN layer to expose a portion of the first GaN layer and forming a third GaN layer coupled to the second GaN layer and the exposed portion of the first GaN layer. The third GaN layer has a third conductivity type. Depending on the desired functionality, the method may further include removing a portion of the third GaN layer to expose a portion of the second GaN layer and forming an electrical contact to the second GaN layer.

In this embodiment, the second GaN layer functions as buried field-plate. To attain the function of a buried field plate and providing protection to the gate, the conductivity type of the second GaN layer is complementary to the conductivity type of third GaN layer. The method may also include forming a source structure coupled to the third GaN layer such that a first portion of the third GaN layer is disposed between the source structure and the second GaN layer.

In one implementation, the method also includes forming a gate structure coupled to the third GaN layer such that a second portion of the third GaN layer is disposed between the gate structure and the second GaN layer. This second portion of the third GaN layer forms the channel. As such, the device current is carried by carriers of the same type as the conductivity type of the third GaN layer. The method also includes forming a drain structure.

For a vertical-drift region FET, the drain can be formed as coupled to the substrate. In this case, the substrate is conductive and the substrate, the first GaN layer and third GaN layer are of the same conductivity type. The conductivity type of the second GaN layer is complementary to third conductivity type.

For a lateral-drift region FET, the drain can be coupled to the third GaN layer and is positioned such that the gate rests between the source and drain. In this case, the conductivity types of the third GaN layer and the substrate can be different from the conductivity type of the third GaN layer and can be set to be desired properties of the substrate. The conductivity type of the second GaN layer is complementary to third conductivity type.

According to a particular embodiment of the present invention, a lateral-drift field-effect transistor (FET) is provided. The lateral-drift FET, also referred to as a lateral-drift region FET, include a substrate, a first GaN-based layer coupled to the substrate, and a second GaN-based layer coupled to the first GaN-based layer. The lateral-drift FET also includes a third GaN-based layer coupled to the second GaN-based layer and a portion of the first GaN-based layer and a channel region disposed in the third GaN-based layer. The lateral-drift FET further comprises a source structure coupled to the third GaN-based layer, a gate structure coupled to the third GaN-based layer, and a drain structure coupled to the third GaN-based layer.

The lateral-drift FET can further include a contact structure coupled to the second GaN-based layer. A portion of the second GaN-based layer can form a field plate structure. The field plate structure can have a plurality of sections that are progressively thinner as a distance from the source structure increases. A first portion of the channel region disposed between the source structure and the second GaN-based layer can be thinner than a second portion of the channel region disposed between the gate structure and the second GaN-based layer.

According to another particular embodiment of the present invention, a vertical-drift field-effect transistor (FET), also referred to as a vertical-drift region FET is provided. The vertical-drift FET includes a substrate, a first GaN-based layer coupled to the substrate, and a second GaN-based layer coupled to the first GaN-based layer. The vertical-drift FET also includes a third GaN-based layer coupled to the second GaN-based layer and a portion of the first GaN-based layer and a channel region disposed in the third GaN-based layer. The vertical-drift FET further includes a source structure coupled to the third GaN-based layer, a gate structure coupled to the third GaN-based layer, and a drain structure coupled to the substrate.

The vertical-drift FET can also include a contact structure coupled to the second GaN-based layer. A portion of the second GaN-based layer forms a field plate structure, which can have a plurality of sections that are progressively thinner as a distance from the source structure increases. A first portion of the channel region disposed between the source structure and the second GaN-based layer is thinner than a second portion of the channel region disposed between the gate structure and the second GaN-based layer.

Numerous benefits are achieved by way of the present invention over conventional techniques. For example, the usage of a buried field plate as described herein can result in improvements in both device performance limits and reliability. By avoiding the use of a dielectric in the field plate, the device will not be subject to certain shortcomings of a dielectric, such as time-dependent dielectric breakdown (TDDB). Additionally, there can be less trapping and/or other interface issues. These and other embodiments of the invention, along with many of its advantages and features, are described in more detail in conjunction with the text below and attached figures.

BRIEF DESCRIPTION OF THE DRAWINGS

FIGS. 2A-2E are simplified cross-sectional diagrams illustrating a process for creating a vertical GaN field-effect transistor (FET), according to one embodiment;

FIG. 3A-3E are simplified cross-sectional diagrams illustrating a process for creating a vertical GaN FET, according to another embodiment.

Figure 1A:
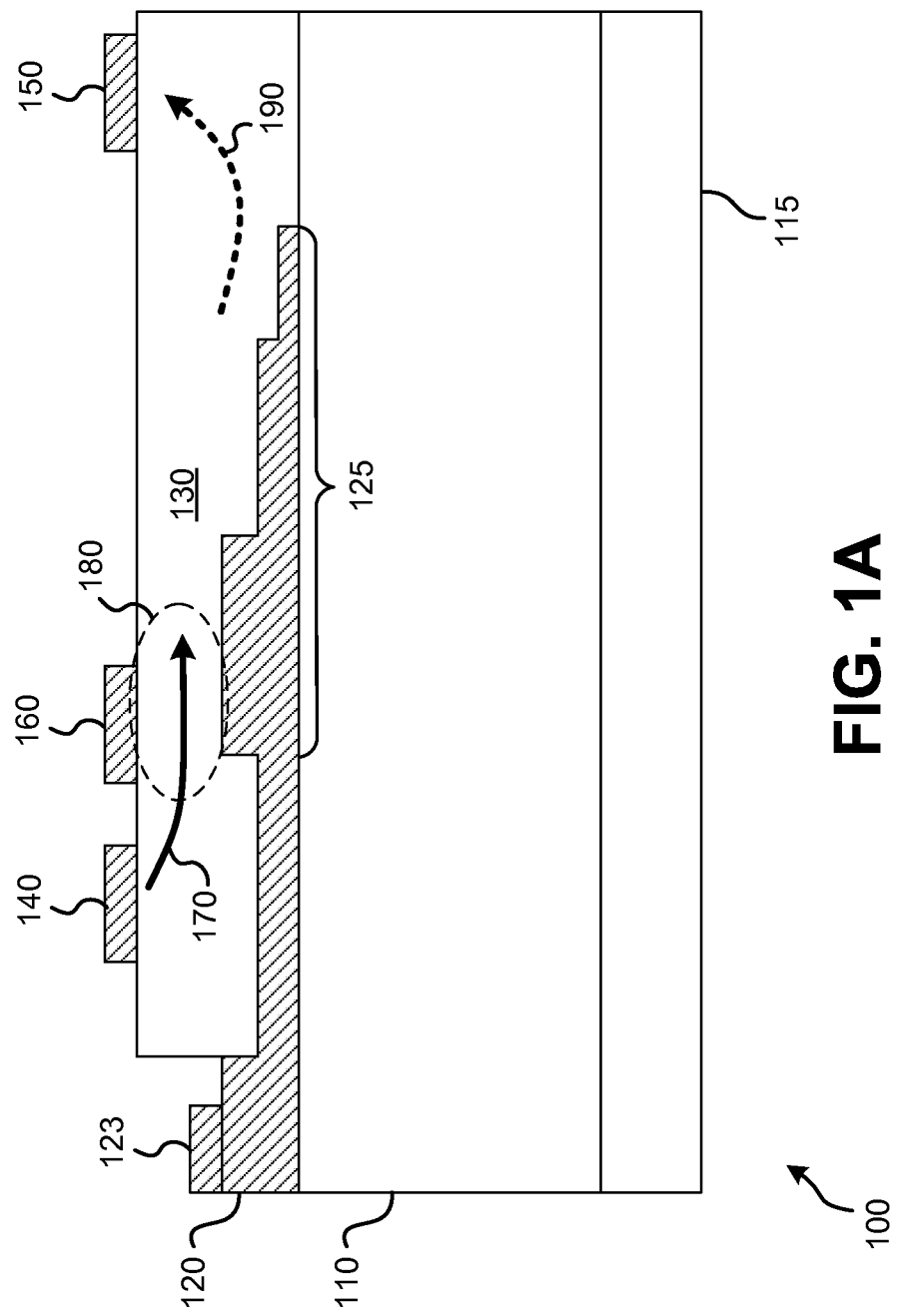
FIG. 1A is simplified cross-sectional diagram illustrating a semiconductor device according to an embodiment.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to providing a buried gate and field plate in a vertical high voltage device made with high band gap materials. Merely by way of example, the invention has been applied to methods and systems for manufacturing field-effect transistors (FETs) using gallium nitride (GaN) (and/or other III-V materials), as well as silicon carbide (SiC). Furthermore, these methods and techniques provided herein can be applied to a variety of vertical and lateral FETs, such as the JFET, MESFET, HEMT, and/or other such structures. Additional description related to field plates is provided in U.S. patent application Ser. No. 13/300,028, entitled "GaN-Based Schottky Barrier Diode with Field Plate," filed on Nov. 18, 2011, the disclosure of which is hereby incorporated by reference in their entirety for all purposes GaN-based electronic and optoelectronic devices are undergoing rapid development, and are expected to outperform competitors in silicon (Si) and other materials. Desirable properties associated with GaN and related alloys and heterostructures include high band gap energy for visible and ultraviolet light emission, favorable transport properties (e.g., high electron mobility and saturation velocity), a high breakdown field, and high thermal conductivity. In particular, electron mobility, μ, is higher than competing materials for a given doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

Homoepitaxial GaN layers on bulk GaN substrates also have relatively low defect density compared to materials grown on mismatched substrates, such as GaN grown on silicon, silicon carbide (SiC), or sapphire. Homoepitaxial GaN layers on bulk GaN substrates therefore have large minority carrier lifetime in intrinsic and/or low-doped regions of semiconductor devices that use these materials, enhancing the carrier injection effect for wider base regions. The low defect density also gives rise to superior thermal conductivity.

Embodiments of the present invention incorporate a buried back gate and field plate in structures utilizing GaN and/or other high band gap materials. For lateral channel high-voltage devices such as the JFET, MESFET or HEMT, control of the electric field along the lateral direction between the gate and drain can be critical for performance and reliability. To achieve the desired field profile control, Si devices such as laterally-diffused metal oxide semiconductor (LDMOS) transistors, employ modulation of the doping along the lateral direction. For such lateral doping modulation, microfabrication tools such as diffusion or ion-implantation are used. However for GaN in particular, but also for other large band gap materials such as SiC, these microfabrication techniques are not available or feasible. Alternatively, such tools may involve difficult techniques or processes detrimental to other device characteristics. Hence, the lateral field control in GaN and similar material systems is best provided by a field-plate.

In all its various forms and shapes that have been discussed in the literature, the field plate structure typically consists of a metallic conducting structure placed on top of a dielectric. Although the lateral field is reduced, the field plate can still have a significant disadvantage because the lateral high field can occur close to the surface along the dielectric-GaN interface. Also a high vertical high field can occur across the dielectric. In the presence of high lateral and vertical fields on the dielectric, the quality and properties of the dielectric-GaN interface and the dielectric itself becomes a critical factor of device performance limits and reliability. Given the various fundamental and practical constraints on the quality and properties of the available dielectrics that can be employed on GaN in particular but also for other large band gap materials, the utility and usefulness of the field-plate method of controlling the lateral field is greatly reduced with the resulting effect that the lateral GaN devices are left at a disadvantage and unable to achieve the theoretical maximum figure-of-merits given by the inherent internal properties of GaN.

Embodiments of the present invention provide a new approach for controlling the lateral field in lateral-channel vertical or lateral drift-region devices using GaN and/or other materials. Rather than using a metallic field-plate acting through a dielectric, embodiments utilize a non-insulating structure for field control. This approach can be applied to wide band gap materials such as GaN and/or SiC, as well as other materials. Although embodiments herein describe the use of GaN, embodiments may utilize any other material system where both p and n type doping is available, including SiC and other wide band gap materials.

FIG. 1A is a cross-sectional illustration of a lateral-channel/lateral-drift region FET 100 according to one embodiment. Components of this embodiment include a substrate 115, first GaN layer 110, field plate structure 120, field plate contact 123, channel region 130, gate contact 160, source contact 140, and drain contact 150. The structure and composition of these components can vary, depending on desired functionality. For example, depending on the specific device structure, the channel region 130 can incorporate n-type, p-type semiconductors, various heterostructures, and/or various vertical doping profiles. A person of ordinary skill in the art will recognize many additions, substitutions, and other variations.

Figure 1B:
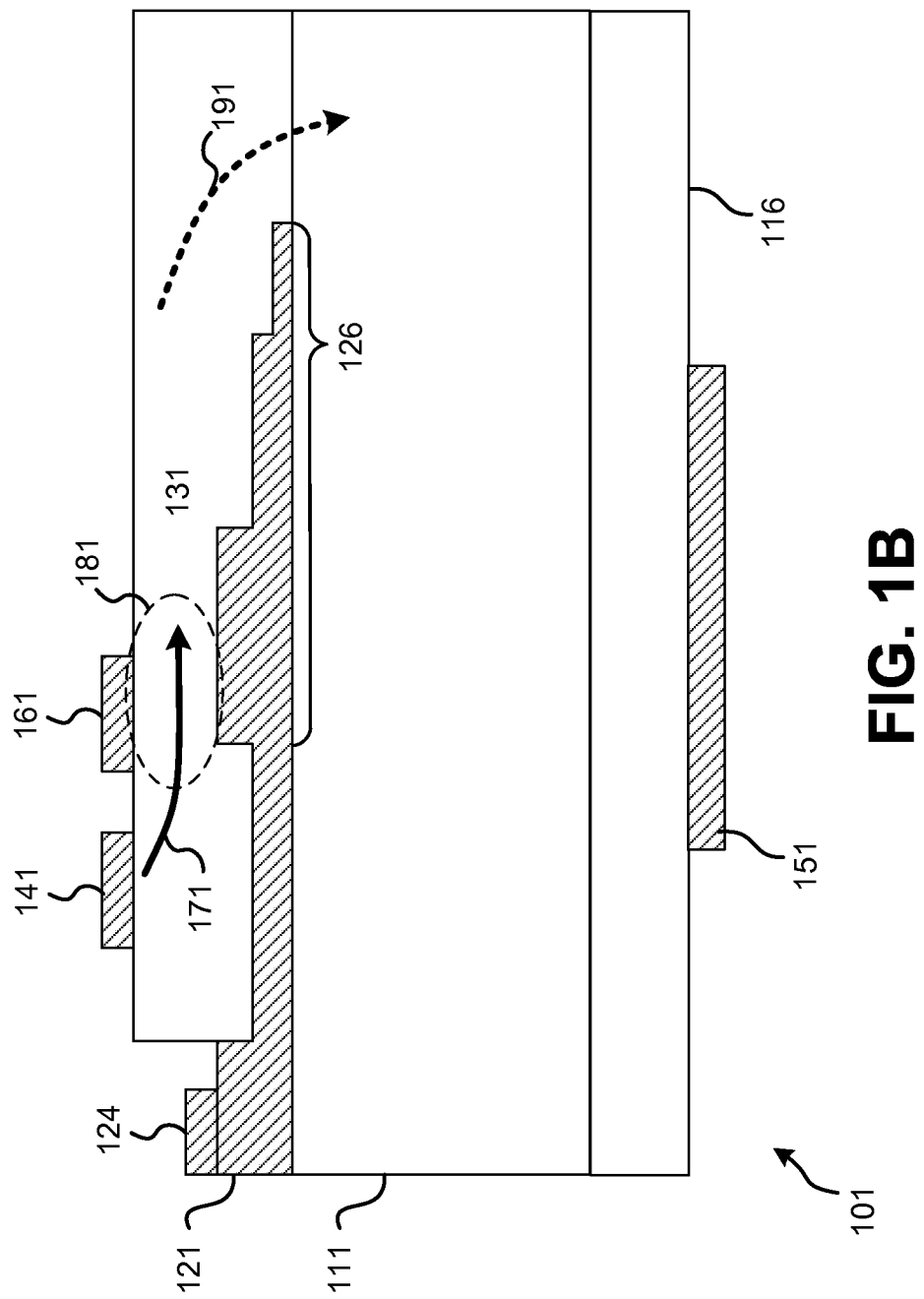
FIG. 1B is simplified cross-sectional diagram illustrating a semiconductor device according to another embodiment.

FIG. 1B is a cross-sectional illustration of a lateral-channel/vertical-drift region FET 101 according to one embodiment. Components of this embodiment include a substrate 116, a first GaN layer 111, field plate structure 121, field plate contact 124, channel region 131, gate contact 161, source contact 141, and drain contact 151. The structure and composition of these components can vary, depending on desired functionality. For example, depending on the specific device structure, the channel region 131 can incorporate n-type, p-type semiconductors, various heterostructures, and/or various vertical doping profiles. A person of ordinary skill in the art will recognize many additions, substitutions, and other variations Operation of the lateral-drift FET 100 can vary, depending on desired functionality. In general, current can flow from the source contact 140 to the drain contact 150 in the direction indicated by the arrow 170 and 190. In a normally-on configuration, the lateral-drift FET 100 can be turned off by applying a bias to the gate contact 160 and/or field plate contact 123 to deplete a region 180 between the gate contact 160 and the field plate structure 120 and cutoff the current. Some configurations may provide normally-off functionality in which the region 180 between the gate contact 160 and the field plate structure 120 is normally depleted, and the device is turned on by applying a bias to the gate contact 160 and/or field plate contact 123. In some embodiments, the gate contact 160 and field plate contact 123 may be electrically connected so that the field plate structure 120 is given the same bias as the gate contact 160. In other embodiments, the field plate structure 120 can be given the same bias as the source contact 140. Alternatively, the field plate contact 123 may be biased separately. The properties of the field plate structure 120 can change depending on the way the field plate structure 120 is biased, and as such, the biasing connection of the field plate structure 120 can be set to control, for example, the capacitance characteristics of the lateral-drift FET 100.

Operation of the vertical-drift FET 101 can vary, depending on desired functionality. In general, current can flow from the source contact 141 to the drain contact 151 in the direction indicated by the arrows 171 and 191. In a normally-on configuration, the vertical-drift FET 101 can be turned off by applying a bias to the gate contact 161 and/or field plate contact 124 to deplete a region 181 between the gate contact 161 and the field plate structure 121 and cutoff the current. Some configurations may provide normally-off functionality in which the region 181 between the gate contact 161 and the field plate structure 121 is normally depleted, and the device is turned on by applying a bias to the gate contact 161 and/or field plate contact 124. In some embodiments, the gate contact 161 and field plate contact 124 may be electrically connected so that the field plate structure 121 is given the same bias as the gate contact 161. In other embodiments, the field plate structure 121 can be given the same bias as the source contact 141. Alternatively, the field plate contact 124 may be biased separately. The properties of the field plate structure 121 can change depending on the way the field plate structure 121 is biased, and as such, the biasing connection of the field plate structure 121 can be set to control, for example, the capacitance characteristics of the vertical-drift FET 101.

Referring to FIGS. 1A and 1B, the field plate structure 120/121 can extend laterally beyond the gate contact 160/161 to provide field plate functionality. Moreover, the field plate structure 120/121 can be patterned in various ways to achieve a detailed control of the field-profile between the gate contact 160/161 and the drain contact 150/151 so that the peak lateral field is reduced and the potential drop along the channel is achieved gradually and smoothly to avoid sharp peaks in the resulting field profile. In the embodiment illustrated in FIG. 1, for example, sections of a portion 125/126 of the field plate structure 120/121 extending laterally beyond the gate contact 160/161 are successively reduced in thickness. In such an embodiment, the thinnest section at the outermost part of the field plate structure 120/121 may deplete in a controlled fashion under high drain bias. This can prevent possible detrimental effects on the breakdown voltage. In some embodiments, such as embodiments that integrate an avalanche diode to the transistor structure, the outermost part of the field plate structure 120/121 can be so that a desired breakdown into the structure 120/121 is achieved at a desired potential.

FIGS. 2A-2E are simplified cross-sectional diagrams illustrating a process flow for fabrication of a FET device according to a first embodiment of the present invention. Although the example provided uses GaN materials, other embodiments may utilize additional and/or alternative materials and/or structures, which may be formed using processes other than those described in relation to FIGS. 2A-2E.

Referring to FIG. 2A, a first GaN layer 205 is formed on the substrate 200. The substrate 200 can comprise any of a wide variety of materials, depending on desired functionality. In some embodiments, the substrate 200 can be a pseudo-bulk GaN material and/or other material on which the first GaN layer 205 is epitaxially grown. Dopant concentrations (e.g., doping density) and thickness of the substrate 200 can vary, depending on, for example, whether the substrate 200 will conduct any current (as for example in the case of a vertical-drift FET). In some embodiments for a vertical-drift FET, a substrate 200 can comprise an n conductivity type, with dopant concentrations ranging from $1 \times 10^{15}$ cm$^{-3}$ to $1 \times 10^{19}$ cm$^{-3}$. Although the substrate 200 is illustrated as including a single material composition, multiple layers can be provided as part of the substrate. Moreover, adhesion, buffer, and other layers (not illustrated) can be utilized during the epitaxial growth process that would be used for the fabrication of a substrate that includes multiple layers. One of ordinary skill in the art would recognize many variations, modifications, and alternatives.

The properties of the first GaN layer 205 depend on the configuration of the FET. For a vertical-drift region FET the first GaN layer 205 forms the drift region. As mentioned earlier for a vertical-drift region FET, the conductivity type of the substrate, first and third GaN layers is the same. The doping and thickness of the first GaN layer can be varied as a function of distance from the substrate and can be adjusted to accommodate a given potential drop. In an example embodiment, the first GaN layer 205 can have a n-conductivity type, with dopant concentrations between about $1 \times 10^{15}$ cm$^{-3}$ to $1 \times 10^{17}$ cm$^{-3}$.

The properties of the second GaN layer 210 can also vary, depending on desired functionality. The second GaN layer 210 can ultimately serve as a field plate and/or back gate for the vertical GaN FET, and therefore can be doped accordingly to help ensure a properly-sized depletion region during on and off states. In an example embodiment, the second GaN layer 210 can have a p conductivity type, with dopant concentrations between about $1 \times 10^{15}$ cm$^{-3}$ to $1 \times 10^{20}$ cm$^{-3}$.

Different dopants can be used to create n- and p-type GaN layers and structures disclosed herein. For example, n-type dopants can include silicon, germanium, oxygen, or the like. P-type dopants can include magnesium, beryllium, zinc, or the like.

The thickness 215 of the second GaN layer 210 can also vary substantially, depending on doping levels, desired breakdown voltage, and/or other factors. Where subsequent etching or other removal processes are used, it can be beneficial to make thickness 215 of the second GaN layer at least as thick as the thickest portion of the desired field plate. This enables a manufacturer to simply remove portions of the second GaN layer 210 to form the desired profile of the field plate. In some embodiments, the thickness 215 can be between 0.1 μm and 0.4 μm, for example. In other embodiments, thickness 215 can be greater than 0.4 μm or less than 0.1 μm.

Figure 2B:
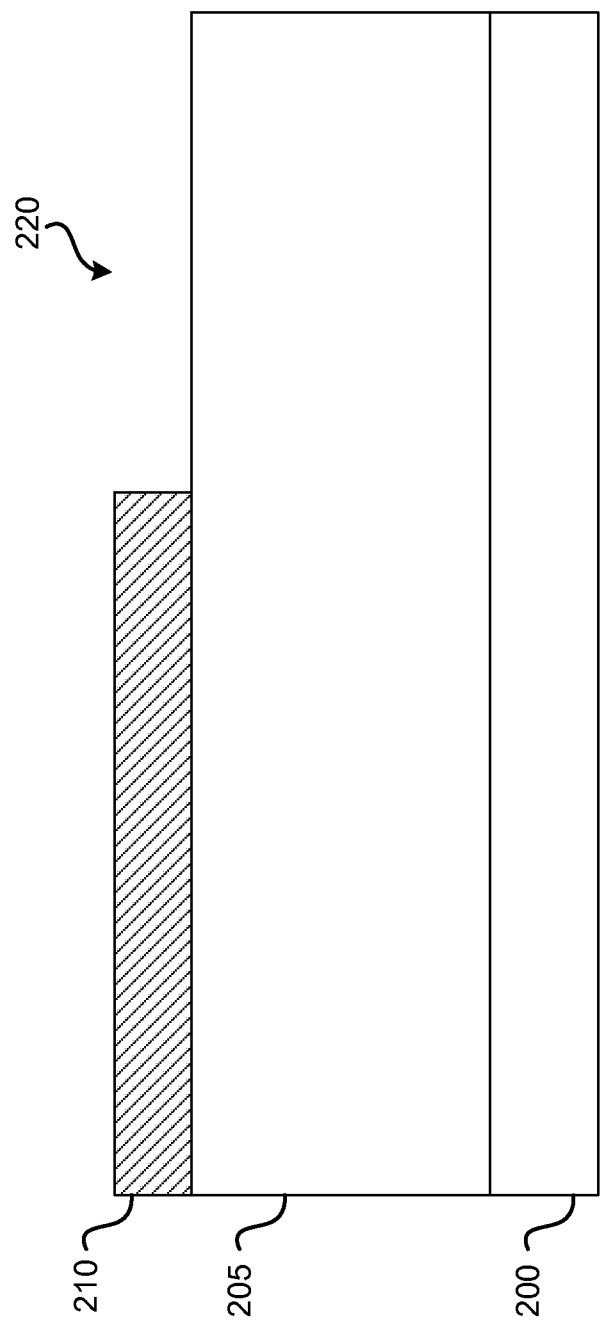

Referring to FIG. 2B, a portion 220 of the second GaN layer 210 is removed to expose a portion of the first GaN layer 205. The positioning of the exposed first GaN layer 205 can vary, depending on desired breakdown voltages and/or other factors. For example, the exposed first GaN layer 205 will lie below the subsequently-formed drain contact, while the remaining portion of the second GaN layer 210 will lie below the subsequently-formed gate contact. The distance between the gate contact and the edge of the field-plate can determine the breakdown voltage of the lateral GaN JFET. When being employed as a field plate, the doping, thickness, length, and patterning of the portion of the second GaN layer 210 extending beyond gate towards the drain contact (see portion 275 of FIG. 2E) can be selected to improve the breakdown voltage. The removal process can include a patterning and etching process. In some embodiments, the use of epitaxial regrowth and growth masks to form one or more of the layers and/or structures described herein may be used additionally or alternatively to layer formation followed by patterning and etching.

Referring to FIG. 2C, a third GaN layer 230 is then formed, coupled to the remaining portion of the second GaN layer 210 and the exposed first GaN layer 205. The third GaN layer 230 forms an active region of the device. More specifically, the third GaN layer 230 forms a channel region through which current flows through the FET. The third GaN layer 230 can include various layered structures that would aid the formation of the device contact structures in latter fabrication steps, for example, through patterning and etching of a portion of the 230 in selected areas. The third GaN layer 230 may be formed using any of a variety of techniques, including epitaxial regrowth.

Attributes of the third GaN layer 230 can vary depending on desired functionality. Where the conductivity of the third GaN layer 230 is chosen to form a p-n junction with the second GaN layer 210. For instance, if the second GaN layer 210 is formed from a p-type GaN material, the third GaN layer 230 will be formed from an n-type GaN material, and vice versa. Furthermore, the third GaN layer 230 can be doped to help ensure desired conductivity and a properly-sized depletion region during on and off states. In an example embodiment, the third GaN layer 230 can have an n conductivity type, with dopant concentrations between about $1 \times 10^{15}$ cm$^{-3}$ to $1 \times 10^{18}$ cm$^{-3}$. Thickness 235 of the channel region of the third GaN layer 230 (that is, the region above the remaining portion of the second GaN layer 210), can also vary, depending on desired functionality. In some embodiments, the thickness 235 of the channel region may be 1 μm or less, although thickness larger than 1 μm may be utilized in other embodiments. In further example embodiments the third GaN layer can also incorporate a heterostructure so that a highly conductive 2 dimensional electron gas is formed.

Figure 2D:
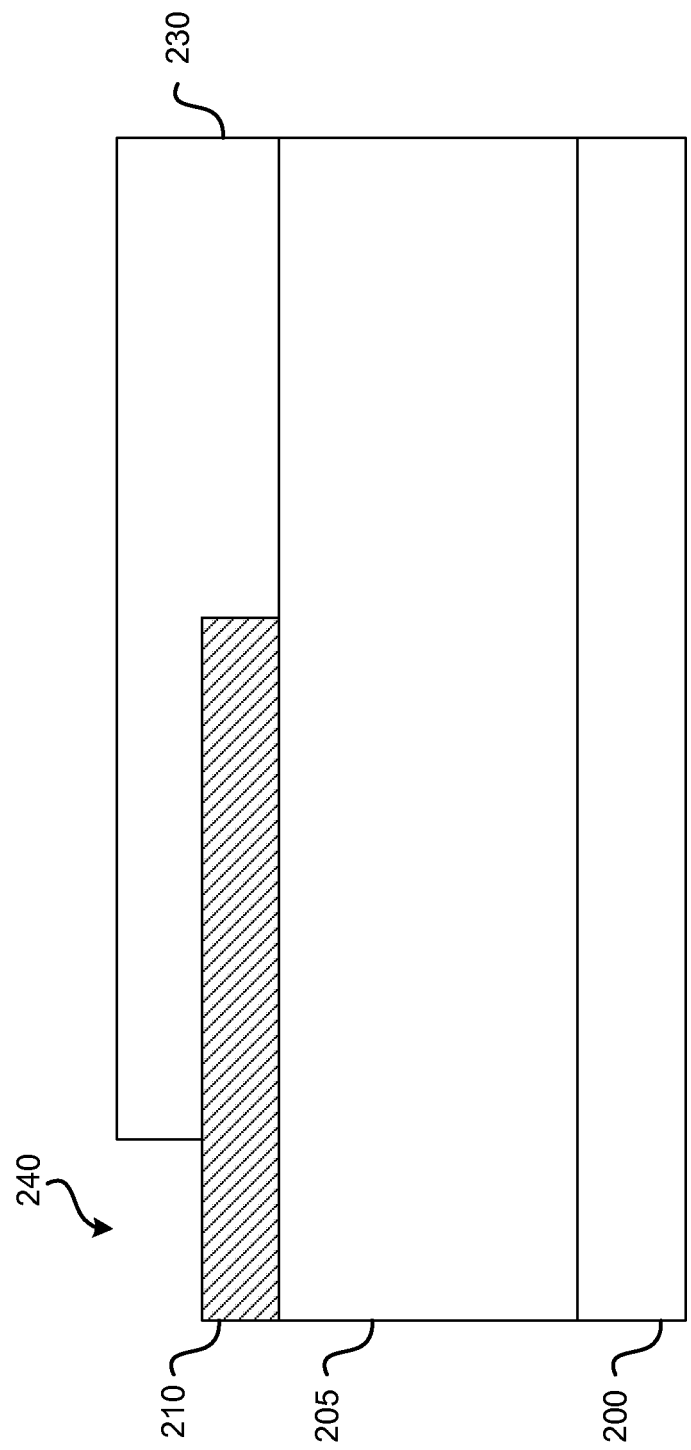

Referring to FIG. 2D, a portion 240 of the third GaN layer 230 above the first GaN layer 210 is removed to expose a portion of the second GaN layer 210. The removal process can include a patterning and etching process.

Figure 2E:
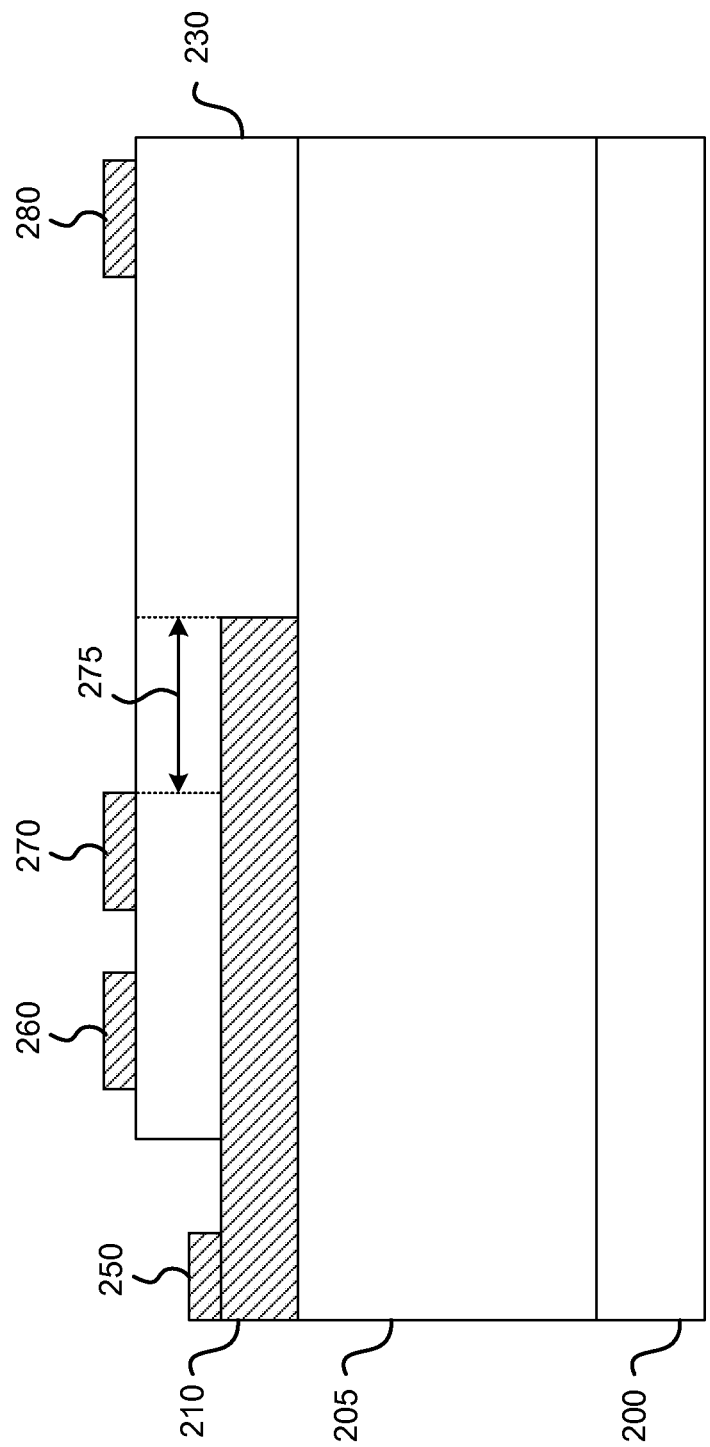

Referring to FIG. 2E, various contact structures are formed on the second GaN layer 210 and third GaN layer 230, including the field plate contact structure 250, source contact structure 260, gate contact structure 270, and drain contact structure 280. Contact structures may comprise any of a variety of materials and may form Ohmic and/or Schottky contacts, based on desired functionality. The fabrication process of the contacts structures may include regrowth, selective area regrowth or patterning and etching of the layer 230. In some embodiments, the contact structures can be formed from GaN (e.g., p-type GaN if the third GaN layer 230 is n-type GaN)

using epitaxial regrowth or etching. That said, the materials used to form some contact structures may be different than those to form other contact structures. For example, the gate contact structure 270 in different device structures can incorporate metals, pGaN, heterostructures, and/or dielectrics, which may differ from the materials used in the other contacts. Various and detailed techniques to manufacture these structures are well-known to workers experienced in the art.

Referring to FIG. 2E, the drain contact 280 can be alternatively placed on the substrate to form a vertical-drift FET. For this case, the conduction properties of the first GaN layer and the substrate are designed appropriately as described earlier.

The gate contact structure 270 is formed over the remaining portion of the second GaN layer 210 to allow the current in the channel portion of the third GaN layer 230 to be pinched off between the second GaN layer 210 and the gate contact structure 270 when bias is applied to the gate contact structure 270 and/or the field plate contact structure 250. Moreover, the remaining portion of the second GaN layer 210 extends laterally beyond the gate contact structure 270 to form a field plate for the device. The lateral distance 275 beyond the edge of the gate contact structure 270 that the remaining portion of the second GaN layer 210 extends can vary, depending on physical features of the device (e.g., distance between the gate contact structure 270 and the drain contact structure 280) and other factors. In some embodiments, this distance 275 can be between 0.25 µm and 5 µm. As an example, the distance can be between 1 µm and 5 µm. Other embodiments may include distances outside this range.

FIGS. 3A-3E are simplified cross-sectional diagrams illustrating a process flow for fabrication of a FET device according to a second embodiment of the present invention. In general, the steps of FIGS. 3A-3E echo the steps shown in FIGS. 2A-2E, as described above, with components 300-390 corresponding to similar components 200-290. In the embodiment of FIGS. 3A-3E, however, the remaining portion of the second GaN layer 310 is patterned (as shown by removed portions 320 in FIG. 3B), causing the lateral profiles of the second GaN layer 310 and third GaN layer 330 to be different. The remaining portion of the second GaN layer 310 can be patterned in various ways to achieve a detailed control of the field-profile between the gate and drain so that the peak lateral field is reduced and the potential drop along the channel is achieved gradually and smoothly. The patterning can include lithography and etching and/or may involve several masked regrowth steps if necessitated by other constraints.

Figure 3A:
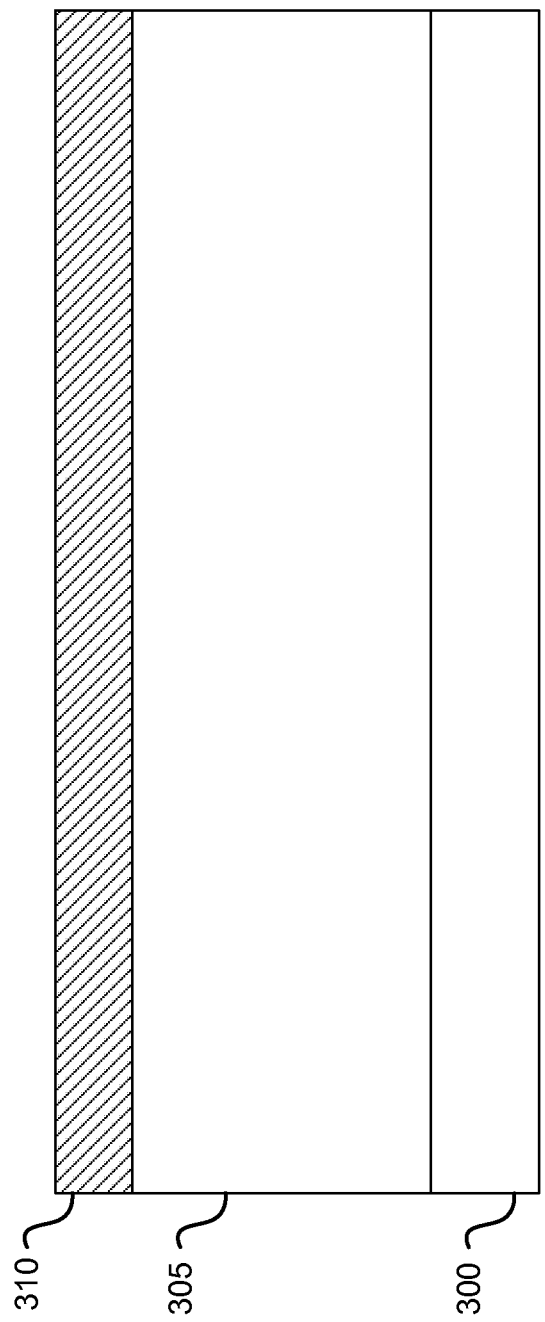
Figure 3B:
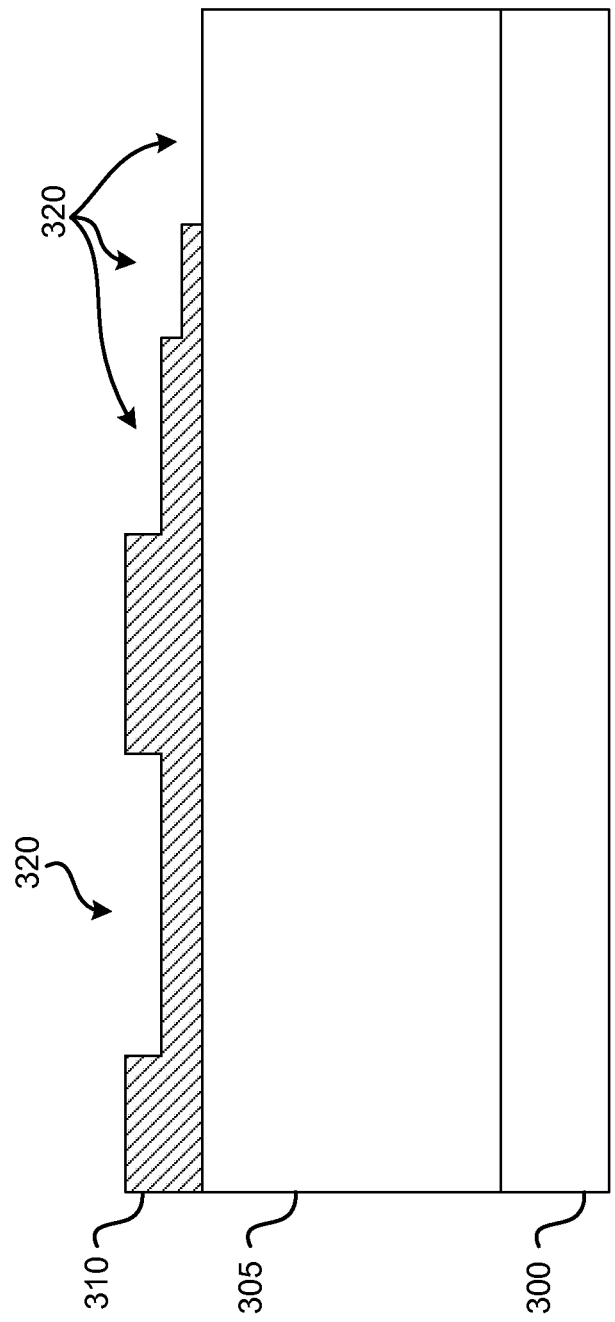
Figure 3C:
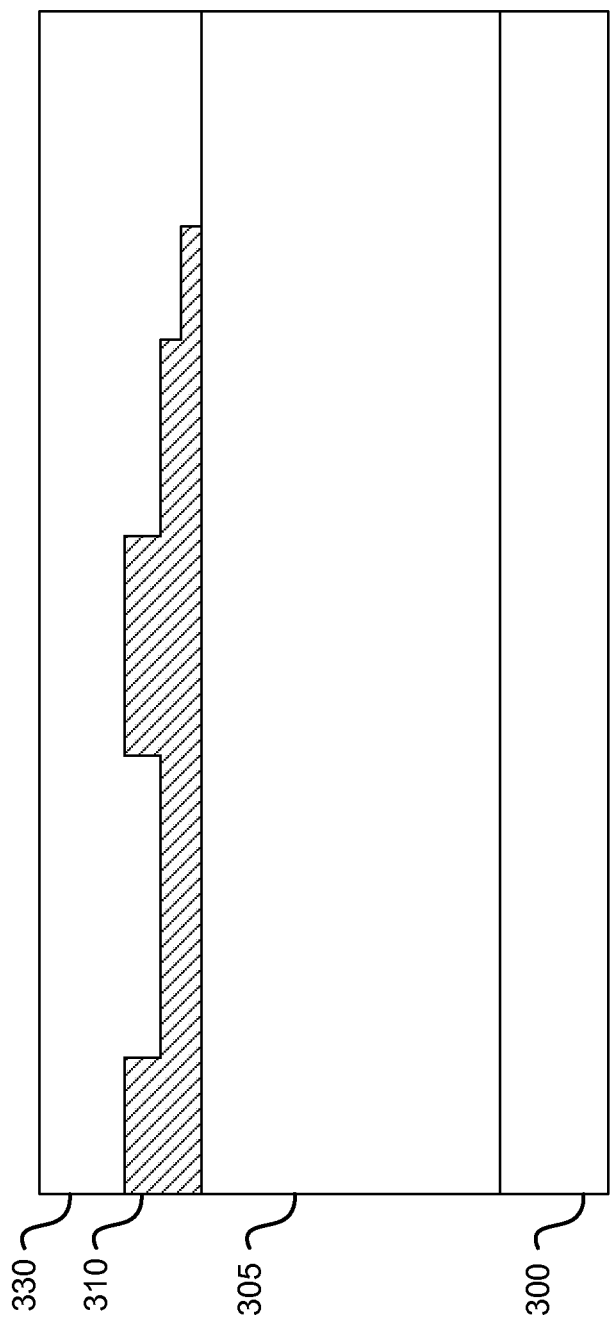
Figure 3E:
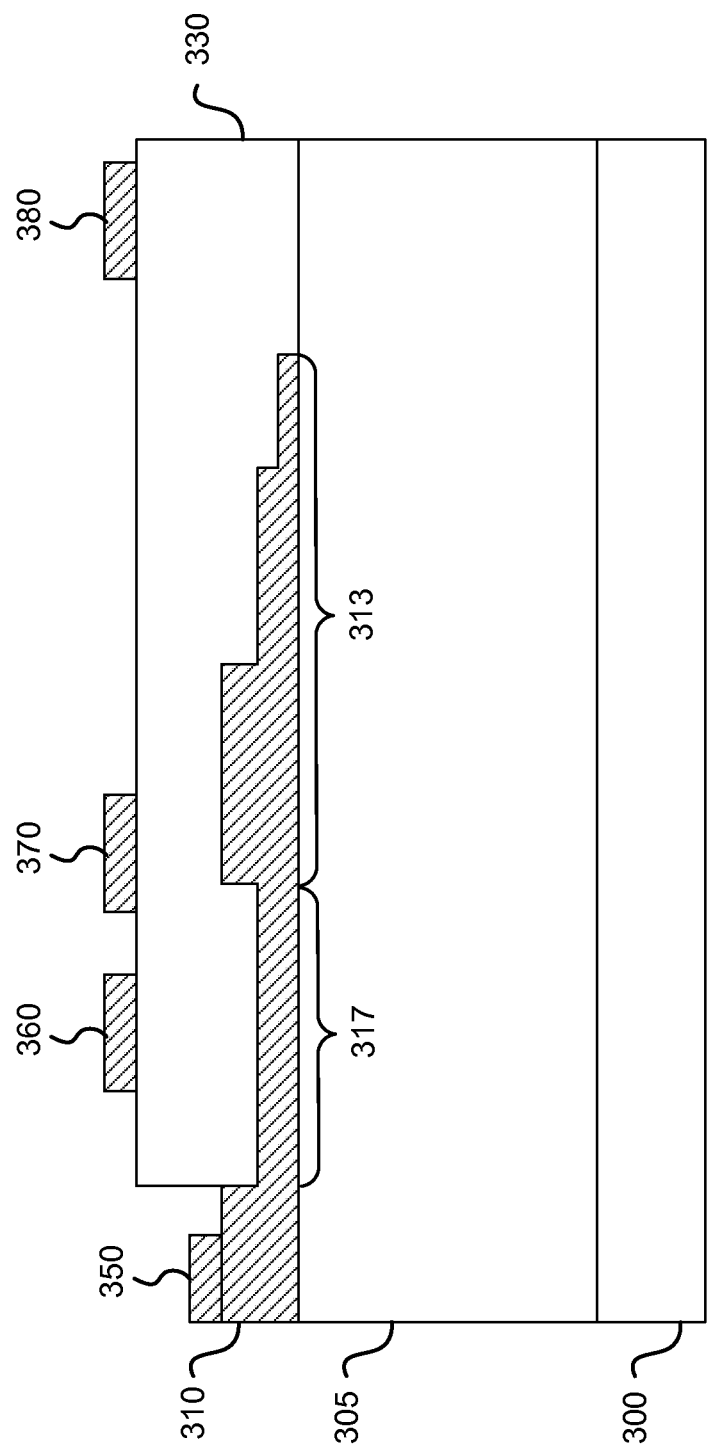

As shown in FIG. 3E, the second GaN layer 310 includes a notched portion 317 below the source contact 360, and a field plate portion 313 extending from below the gate contact 370 laterally toward the drain contact 380. The notched portion 317 can allow for a larger channel region under the source contact 360, which can reduce source-to-gate access resistance. Thicknesses of these portions can vary, and may depend on operating voltage, doping profiles, and/or other factors. In an example embodiment, the thickness of the notched portion is 0.1 µm, and thicknesses of the field plate portion 313 range from 0.5 µm to 0.1 µm. Other embodiments can have other thicknesses.

Embodiments can incorporate numerous variations to the example shown in FIGS. 3A-3E. Thicknesses can vary from those described in the example above. Furthermore, although the field plate portion 313 illustrated has three sections that are progressively thinner as the distance from the source contact 360 increases, embodiments may include more or fewer sections. A person of ordinary skill in the art will recognize many additions, substitutions, and/or other variations.

The processes shown in FIGS. 2A-2E and 3A-3E are provided as examples only, and are not limiting. Furthermore, the figures are not drawn to scale, and the manufacture of the FET can include additional steps and/or features that are not shown. For example, a drain contact may be created on the bottom of substrates 200 and/or 300 (additionally or alternatively to the drain contacts 280, 380 illustrated) to provide vertical current flow. The layers and/or structures described herein may include a number of sublayers, substructures, and/or other components to provide the functionality described herein. One of ordinary skill in the art would recognize many variations, modifications, and alternatives.

Figure 4:
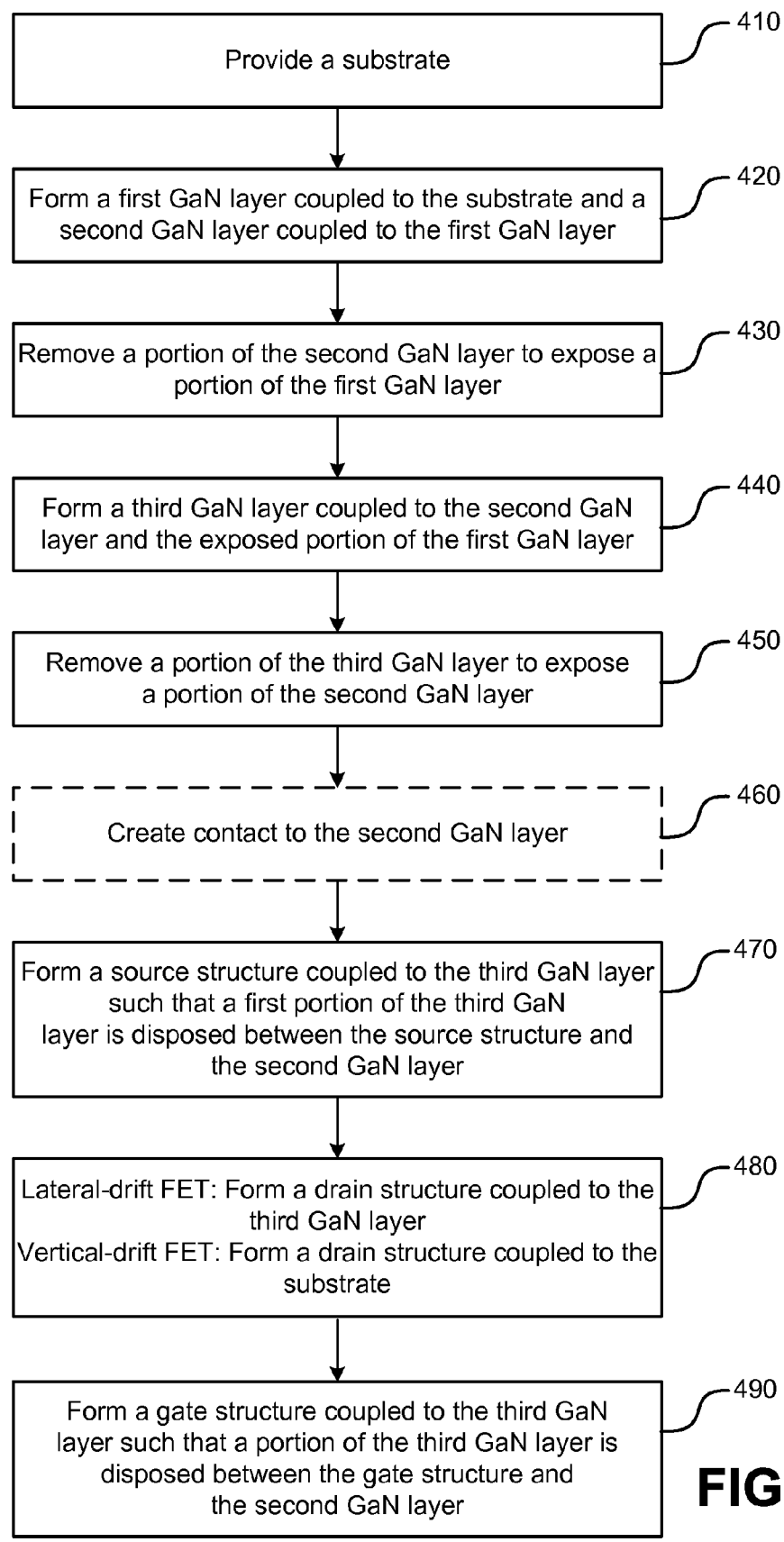
FIG. 4 is simplified flowchart illustrating an embodiment of a method of fabricating a vertical GaN FET with a buried field plate.

FIG. 4 is simplified flowchart illustrating an example method of fabricating either a lateral-drift GaN FET or a vertical-drift GaN FET, such the FETS of the embodiments previously described. The method can include providing a substrate (410). The substrate can conductivity can be adjusted to provide the desired properties. The substrate can include one or more layers and/or materials (such as GaN), including composite structures of multiple layers, on which subsequent layers may be formed. One of ordinary skill in the art would recognize many variations, modifications, and alternatives. As discussed above, suitable doping and thickness can be chosen for embodiments in which device current flows through one of more of the GaN layers described below and the substrate.

The method further includes forming a first GaN layer coupled to the substrate and a second GaN layer coupled to the first GaN layer (420). The field plate and/or back gate structure(s) can be formed from the second GaN layer. Thus, properties of the second GaN layer (e.g., doping and thickness) can be adjusted accordingly.

Epitaxial regrowth can be used, for example, to form the first and/or second GaN layers. One method of forming the first and/or second GaN layers (and/or other GaN layers described herein) can be through a regrowth process that uses an in-situ etch and diffusion preparation processes. These preparation processes are described in U.S. patent application Ser. No. 13/198,666, filed Aug. 4, 2011, entitled "Method and System for Formation of P-N Junctions in Gallium Nitride Based Electronics," the entirety of which is hereby incorporated by reference.

The method further includes removing a portion of the second GaN layer to expose a portion of the first GaN layer (430). This can involve a patterning and etch process, which may include additional steps of depositing, patterning, and removing photoresist and/or an etch mask. The location of the removed portion of the second GaN layer can vary depending on the location of subsequently-formed gate and drain structures, as previously described. In some embodiments, the lateral profiles of the first and/or second GaN layers can be altered through additional regrowth and/or etching steps to provide a desired lateral field profile for the device.

The method also includes forming a third GaN layer coupled to the second GaN layer and the exposed portion of the first GaN layer (440). As indicated previously, the third GaN layer can have the opposite conductivity type as the second GaN layer, thereby allowing a depletion region to be formed at the interface of the two layers. The channel region of the FET can be formed from the third GaN layer. Thus, properties such as doping and thickness of the third GaN layer can be provided accordingly. A portion of the third GaN layer can be removed to expose a portion of the second GaN layer (450), enabling a field plate contact to be subsequently formed on the exposed portion of the second GaN layer (460). In some embodiments, however, the field plate may be floating (i.e., not tied to a voltage source). In such cases, a field plate contact may not be created and/or used.

A source structure is then formed, coupled to the third GaN layer such that a first portion of the third GaN layer is disposed between the source structure and the second GaN layer (470). For a lateral-drift FET, a drain structure is formed, coupled to the third GaN layer and for a vertical-drift FET, a drain structure is formed, coupled to the substrate (480). For an IGFET, source and drain structures can be formed incorporating GaN of the opposite conductivity type as the third GaN layer. If the third GaN layer is n-type GaN, the source and drain structures can be p-type GaN, and vice versa.

A gate structure is then formed, coupled to the third GaN layer such that a second portion of the third GaN layer is disposed between the gate structure and the second GaN layer (490). As indicated above, the gate structure can incorporate metals, pGaN, heterostructures, and/or dielectrics. This enables current flow between the source and drain structures to be controlled by biasing the gate structure and/or second GaN layer. Additionally, the second GaN layer can extend laterally beyond the gate structure toward the drain structure, enabling a portion of the second GaN layer to act as a field plate for the device. Spacing between the gate structure and the drain structure can determine breakdown voltage. The distance of the lateral extension of the second GaN layer beyond the field gate can be chosen accordingly.

It should be appreciated that the specific steps illustrated in FIG. 4 provide a particular method of fabricating a lateral-drift or a vertical-drift GaN FET according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Furthermore, although embodiments provided above, including FIG. 4, are discussed in terms of GaN structures and layers, the present invention is not limited to these particular binary III-V materials and is applicable to a broader class of semiconductor materials with a wide band gap, including SiC and materials from the GaAs material group. Moreover, other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a lateral-channel/lateral-drift GaN field-effect transistor (FET), the method comprising:
   providing a substrate;
   providing a first GaN layer coupled to the substrate, wherein the first GaN layer has a first conductivity type;
   forming a second GaN layer coupled to the first GaN layer, wherein the second GaN layer has a second conductivity type;
   removing a portion of the second GaN layer to expose a portion of the first GaN layer;
   forming a third GaN layer coupled to the second GaN layer and the exposed portion of the first GaN layer, wherein the third GaN layer has a third conductivity type;
   removing a portion of the third GaN layer to expose a portion of the second GaN layer;
   forming a source structure coupled to the third GaN layer, wherein a first portion of the third GaN layer is disposed between the source structure and the second GaN layer;
   forming a drain structure coupled to the third GaN layer; and
   forming a gate structure coupled to the third GaN layer, wherein a second portion of the third GaN layer is disposed between the gate structure and the second GaN layer.

2. The method of claim 1 further comprising forming a contact coupled to the exposed portion of the second GaN layer.

3. The method of claim 1 further comprising removing portions of the second GaN layer to form a plurality of sections that are progressively thinner as a distance from the second GaN layer to the gate structure increases.

4. The method of claim 1 wherein forming the gate structure comprises forming the gate structure with metal.

5. The method of claim 1 wherein forming the gate structure comprises forming the gate structure incorporating GaN of the second conductivity type.

6. The method of claim 1 further comprising removing a second portion of the second GaN layer, wherein the first portion of the third GaN layer is thinner than the second portion of the third GaN layer.

7. The method of claim 1 wherein the third GaN layer comprises n-type GaN.

8. The method of claim 1 wherein the second GaN layer comprises p-type GaN.

9. The method of claim 1 wherein at least one of the source structure, the drain structure, or the gate structure comprises a metal.

10. The method of claim 1 wherein at least one of the source structure, the drain structure, or the gate structure comprises a metal and a semiconductor material.

11. A method for fabricating a lateral-channel/vertical-drift GaN field-effect transistor (FET), the method comprising:
   providing a substrate;
   providing a first GaN layer coupled to the substrate, therein the first GaN layer has a first conductivity type;
   forming a second GaN layer coupled to the first GaN layer, wherein the second GaN layer has a second conductivity type;
   removing a portion of the second GaN layer to expose a portion of the first GaN layer;
   forming a third GaN layer coupled to the second GaN layer and the exposed portion of the first GaN layer, wherein the third GaN layer has a third conductivity type;
   removing a portion of the third GaN layer to expose a portion of the second GaN layer;
   forming a source structure coupled to the third GaN layer, wherein a first portion of the third GaN layer is disposed between the source structure and the second GaN layer;
   forming a drain structure coupled to the substrate; and forming a gate structure coupled to the third GaN layer, wherein a second portion of the third GaN layer is disposed between the gate structure and the second GaN layer.

12. The method of claim 11 further comprising removing portions of the second GaN layer to form a plurality of sections that are progressively thinner as a distance from the second GaN layer to the gate structure increases.

13. The method of claim 11 the first portion of the third GaN layer is thinner than the second portion of the third GaN layer.

* * * * *